US 9,270,294 B2

(12) United States Patent
Duesterberg et al.

(10) Patent No.: US 9,270,294 B2
(45) Date of Patent: Feb. 23, 2016

(54) METHOD AND DEVICE FOR PRODUCING A DIGITAL SIGNAL

(71) Applicant: Lenze Automation GmbH, Aerzen (DE)

(72) Inventors: Dirk Duesterberg, Emmerthal (DE); Heiko Stichweh, Springe (DE)

(73) Assignee: Lenze Automation GmbH, Aerzen (DE)

( * ) Notice: Subject to any disclaimer, the term of this patent is extended or adjusted under 35 U.S.C. 154(b) by 0 days.

(21) Appl. No.: 14/763,450

(22) PCT Filed: Jan. 24, 2014

(86) PCT No.: PCT/EP2014/051414
§ 371 (c)(1),
(2) Date: Jul. 24, 2015

(87) PCT Pub. No.: WO2014/114755
PCT Pub. Date: Jul. 31, 2014

(65) Prior Publication Data
US 2015/0365101 A1    Dec. 17, 2015

(30) Foreign Application Priority Data

Jan. 26, 2013   (DE) .......................... 10 2013 201 253

(51) Int. Cl.
*H03M 3/00* (2006.01)
*H03M 1/12* (2006.01)
*H03M 1/00* (2006.01)

(52) U.S. Cl.
CPC ................ *H03M 3/458* (2013.01); *H03M 1/00* (2013.01); *H03M 1/12* (2013.01); *H03M 3/30* (2013.01)

(58) Field of Classification Search
CPC ............ H03M 3/30; H03M 1/12; H03M 1/00
USPC ......................................... 341/143, 155, 156
See application file for complete search history.

(56) References Cited

U.S. PATENT DOCUMENTS

| 4,947,171 A | 8/1990 | Pfeifer et al. |
| 5,646,621 A | 7/1997 | Cabler et al. |

(Continued)

FOREIGN PATENT DOCUMENTS

| DE | 10 2011 080 586 A1 | 2/2013 |
| EP | 0 335 988 A1 | 10/1989 |

(Continued)

OTHER PUBLICATIONS

International Search Report dated Jan. 5, 2015 with English translation thereof {Six (6) pages}.

*Primary Examiner* — Joseph Lauture
(74) *Attorney, Agent, or Firm* — Crowell & Moring LLP

(57) ABSTRACT

A method is provided for generating a digital signal from an analog signal generated using a frequency converter on the basis of pulse width modulation with a variable period duration, values of the digital signal corresponding to an average value of the analog signal over an associated period duration of the pulse width modulation. The method includes the acts of: generating a bit stream on the basis of the analog signal using a sigma-delta modulator, the bit stream being generated with a constant modulator clock; generating temporally successive digital samples during an associated period duration by filtering the bit stream using a number of digital filters, intervals of time between the temporally successive digital samples being multiples of the modulator clock, the digital filters being started with a time delay with respect to one another in the intervals of time of the multiples of the modulator clock, and a respective digital filter outputting an associated digital sample, and forming an average value of the digital samples generated during the associated period duration, the average value forming the value of the digital signal (DS) for the associated period duration.

10 Claims, 4 Drawing Sheets

(56) References Cited

U.S. PATENT DOCUMENTS

| | | |
|---|---|---|
| 8,970,417 B2 | 3/2015 | Duesterberg et al. |
| 2006/0103555 A1 | 5/2006 | Antonesei |
| 2006/0164273 A1* | 7/2006 | Hickling ............... H03H 15/00 341/143 |
| 2006/0170579 A1 | 8/2006 | Ohnhaeuser et al. |
| 2010/0085230 A1 | 4/2010 | Son |

FOREIGN PATENT DOCUMENTS

| | | |
|---|---|---|
| GB | 2 440 559 A | 2/2008 |
| JP | 2006-140962 A | 6/2006 |
| WO | WO 02/091581 A2 | 11/2002 |

* cited by examiner

METHOD AND DEVICE FOR PRODUCING A DIGITAL SIGNAL

BACKGROUND AND SUMMARY OF THE INVENTION

The invention relates to a method and a device for generating a digital signal from an analog signal generated using a frequency converter on the basis of pulse width modulation with a variable period duration, values of the digital signal corresponding to an average value of the analog signal over an associated period duration of the pulse width modulation.

Conventional frequency converters typically output a so-called phase voltage which is generated on the basis of pulse width modulation. An effective voltage generated using the frequency converter at a winding of a multiphase electric motor is the difference between two such phase voltages. For the rest, reference is also made to the relevant specialist literature.

During the controlled driving of electric motors, it may be necessary to determine the DC voltage component of the pulse-width-modulated voltage or of the effective motor voltage.

GB 2 440 559 A describes a method in which a pulse-width-modulated voltage generated by a frequency converter is digitized using a sigma-delta modulator. In order to determine a respective digital measured voltage value, an integral is continuously formed over precisely one associated period duration of the pulse width modulation. This formation of an integral corresponds to a first-order Hogenauer filter.

Frequency converters are often operated in a group and are synchronized in this case using a superordinate controller. During synchronization, the need may arise to change the period duration on which the pulse width modulation is based.

In the method described in GB 2 440 559 A, a change in the period duration could be regenerated by accordingly taking into account more or fewer modulator clocks in the integration.

If higher-order digital filters are required on account of the demands imposed on the signal quality, a bit stream output by a sigma-delta modulator may be filtered, for example, using a higher-order, for example a second-order or third-order, Hogenauer filter.

The transfer function of such Hogenauer filters is determined by a clock of the bit stream output by the sigma-delta modulator (modulator clock), a filter order and the so-called oversampling ratio. The oversampling ratio describes the ratio between the input sampling rate and the output sampling rate generated during sampling rate conversion, that is to say the ratio between the modulator clock and the clock of the filtered values or samples output by the filter. The sampling rate consequently results from the modulator clock divided by the oversampling ratio. For the rest, reference is also made to the relevant specialist literature in this respect.

In order to be able to measure the voltage in a pulse-width-modulating system using a Hogenauer filter, the resulting sampling rate of the Hogenauer filter must be an integer multiple of the fundamental frequency of the pulse width modulation as exactly as possible in order to be able to effectively suppress the switching frequency. An integral or average value can then be formed over these samples within a respective period of the pulse width modulation in order to apply the notch frequency to the switching frequency.

In order to adapt the above-mentioned method to a variable period duration of the pulse width modulation, the modulator clock can be dynamically adapted to the period duration, for example. However, jitter of the modulator clock or omission of clocks results in a considerable reduction in the maximum possible number of effective bits (ENOB). Alternatively or additionally, the oversampling ratio can be dynamically adapted to the period duration of the pulse width modulation, but this results in miscalculations during adaptation in the Hogenauer filter and also influences the frequency behavior and the gain of the Hogenauer filter.

The invention is based on the object of providing a method and a device for generating a digital signal from an analog signal generated using a frequency converter on the basis of pulse width modulation with a variable period duration, which method and device can be easily adapted to a variable period duration and can be used to implement filters with an order of greater than one.

The invention achieves this object by means of a method and a device according to embodiments of the invention.

The method is used to produce a digital signal from an analog signal which is generated using a frequency converter on the basis of pulse width modulation with a variable period duration. Values of the digital signal correspond to an average value of the analog signal over an associated period duration of the pulse width modulation.

The digital signal or its values is/are continuously generated for each period of the pulse-width-modulated analog signal. The values of the digital signal have a delimited and graduated set of values. The digital signal may also be defined, in terms of its temporal sequence, only at particular periodic times, for example at the end of a respective period of the pulse-width-modulated analog signal, or may have a change in its values. The digital signal is formed from the analog signal, which describes the temporally continuous profile of a physical variable, for example current or voltage, by means of sampling, which is carried out at defined times, and quantization. Corresponding coding can be used to convert the digital signal or its values into a binary representation, for example with a digital word length of 8, 16, 24 or 32 bits.

In the method, a bit stream (binary range of values of zero and one) is generated on the basis of the analog signal using a conventional sigma-delta modulator, the bit stream being generated with a constant modulator clock, for example in a modulator clock range of between 5 MHz and 50 MHz.

A plurality of temporally successive digital samples are generated from the bit stream generated in this manner during a respective period duration or a respective period of the pulse width modulation. The digital samples can be coded in a binary manner with a word length of 2, 4, 8, 16 or 32 bits, for example.

Intervals of time between respective successive digital samples are integer multiples of the modulator clock.

The operation of generating the temporally successive digital samples comprises the following steps:

The bit stream is filtered using a number of (at least two) independent digital, in particular sampling-rate-reducing, filters for generating the digital samples, the digital filters being started with a time delay at the desired interval of time between the successive digital samples. After a respective filter has been started, the bit string can be applied to the filter in the modulator clock and the filter can process the bit values in the bit string according to its filter function, can reduce the bit rate, can output its associated digital sample after a processing period, etc.

The period duration can be represented in multiples of the modulator clock. If the period duration is k modulator clocks and a number of samples, which are generated during a respective period duration or a respective period of the pulse width modulation and are distributed over the respective period duration or respective period, is r, the intervals of time between successive digital samples are each set to k/r modulator clocks, provided that k can be divided by r without a remainder. For this situation, the digital samples are distributed in a completely equidistant manner over the period duration or period.

If k cannot be divided by r without a remainder, the intervals of time between successive samples are set in such a manner that a distribution of the samples which is as temporally equidistant as possible over the period duration or period results, in which case a sum of the intervals of time between the successive samples is equal to the period duration.

If the period duration in modulator clock units is k=31 and the number of samples is r=3 as a numerical example, the intervals of time in modulator clock units may be (11, 10, 10), (10, 11, 10) or (10, 10, 11).

If the period duration in modulator clock units is k=32 and r=3 as another numerical example, the intervals of time may be (11, 11, 10), (10, 11, 11) or (11, 10, 11).

Finally, if the period duration in modulator clock units is k=33 and r=3 as another numerical example, the intervals of time (11, 11, 11) are selected as an equidistant distribution.

The digital filters may be operated or may operate at least temporarily in a temporally overlapping manner during the period duration or period.

A respective digital filter outputs an associated digital sample, the digital samples likewise being output by the different digital filters with a temporal distance from one another.

A value of the digital signal which belongs to the respective period duration or period and represents the average value of the analog signal over the period duration or period is calculated by forming an average value of the digital samples generated during the period duration or period.

The intervals of time between the digital samples may be set or calculated on the basis of the variable period duration PD. The number of digital samples per period duration or period may be stipulated as constant irrespective of the period duration. It is only necessary to ensure that a distribution of the digital samples which is as equidistant as possible within the period duration or period results. In other words, the intervals of time between the digital samples are set or calculated on the basis of the variable period duration PD in such a manner that a distribution of the digital samples which is as temporally equidistant as possible over the period or period duration results.

A respective digital filter may have or implement a $sinc^3$ filter function.

A respective digital filter may be designed to output an associated digital sample every n modulator clocks.

The intervals of time between the temporally successive digital samples in modulator clock units may each be smaller than n in order to avoid weighting gaps.

The number of digital filters may be selected to be equal to the number of digital samples per period duration of the pulse width modulation, that is to say each digital filter outputs precisely one associated digital sample.

Alternatively, the number of digital filters may be selected to be smaller than the number of digital samples per period duration of the pulse width modulation, that is to say a digital filter outputs more than only an individual associated digital sample in succession over the course of the period duration or period. For this situation, the digital filter is restarted immediately or after a waiting time after it has output a digital sample.

$64 \leq n \leq 128$ may apply.

The digital filters may each have identical weighting functions (pulse response), the digital filters being started with a time delay with respect to one another in such a manner that weighting functions of digital filters which produce temporally adjacent digital samples at least partially overlap.

The period duration of the pulse width modulation may be in a range between 62.5 µs and 1 ms.

The device for generating a digital signal from an analog signal generated using a frequency converter on the basis of pulse width modulation with a variable period duration is designed to carry out the method mentioned above. The device has: a sigma-delta modulator for generating the bit stream, a number of (at least two) digital filters for filtering the bit stream and generating the digital samples, and an averager for forming the average value of the digital samples generated during the period duration.

BRIEF DESCRIPTION OF THE DRAWINGS

The invention is described below with reference to the drawings which illustrate embodiments of the invention and in which schematically.

DETAILED DESCRIPTION OF THE DRAWINGS

Figure 1:
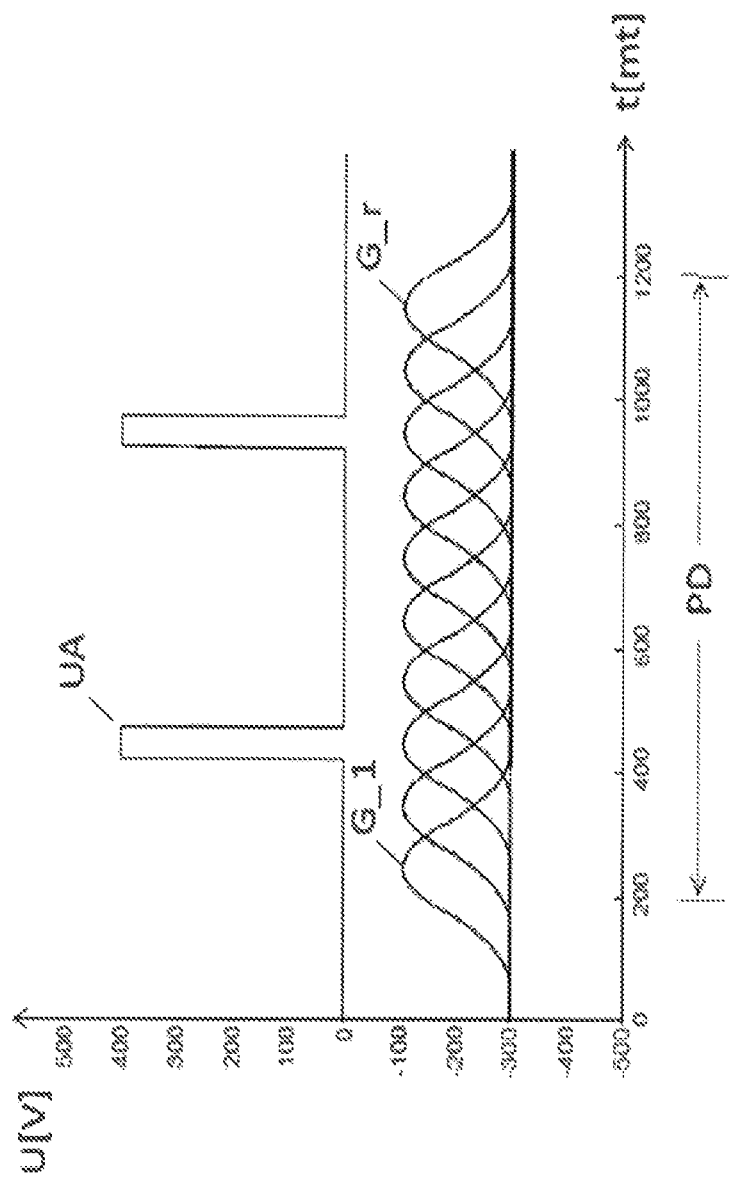
FIG. 1 shows an analog signal generated using a frequency converter on the basis of pulse width modulation with a variable period duration with associated weighting functions of digital filters.

FIG. 1 shows an analog signal generated using a conventional frequency converter (not illustrated) on the basis of pulse width modulation with a variable period duration PD in the form of a voltage UA with associated weighting functions G_1 to G_r of digital filters (see digital filters 2_1 to 2_r in FIG. 2 and digital filters 2'_1 to 2'_r in FIG. 3) over time in modulator clock units mt.

The analog signal or the voltage UA is the resultant voltage at a motor winding of an electric motor (not illustrated) in the context of driving by the conventional frequency converter.

FIG. 1 shows, by way of example, a period or period duration PD. It goes without saying that the method is accordingly carried out for preceding periods or period durations and subsequent periods or period durations.

Figure 2:
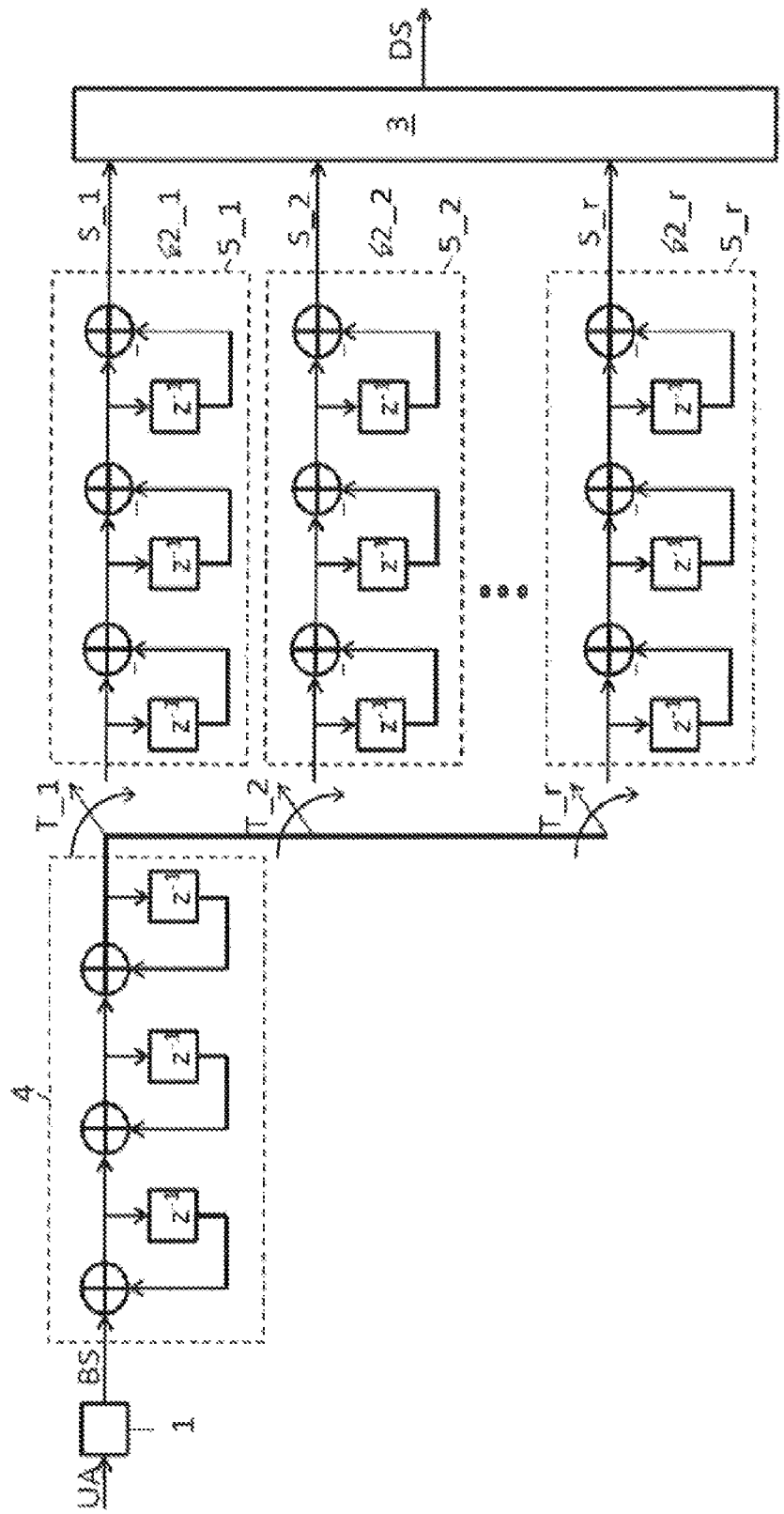
FIG. 2 shows a device for generating a digital signal from the analog signal shown in FIG. 1 according to a first embodiment.

FIG. 2 shows a device for generating a digital signal DS from the analog signal UA shown in FIG. 1 according to a first embodiment, values of the digital signal DS representing an average value of the analog signal UA over a corresponding period or period duration PD.

The device has a conventional sigma-delta modulator 1 to which the voltage UA is applied. It goes without saying that provision may be made of a suitable level converter (not illustrated) which converts the voltage UA to a voltage level suitable for the sigma-delta modulator 1.

The sigma-delta modulator 1 conventionally produces a bit stream BS on the basis of the analog signal UA with a constant modulator clock of 20 MHz, for example.

The bit stream is processed by a modified third-order Hogenauer filter with interleaved decimation stages or decimation stages which operate in a temporally overlapping manner.

The modified Hogenauer filter has a common integrator stage 4 and r different comb stages 5_1 to 5_r, the integrator stage 4 and the comb stages 5_1 to 5_r together forming r digital third-order digital Hogenauer filters 2_1 to 2_r for filtering the bit stream BS and generating associated digital samples S_1 to S_r.

The digital samples S_1 to S_r are generated in a temporally successive manner using the associated digital filters 2_1 to 2_r (see FIG. 4), the intervals of time between the digital samples S_1 to S_r being able to be represented in integer multiples of the modulator clock.

The digital filters 2_1 to 2_r are started with a time delay with respect to one another. The time delay corresponds to (is equal to) the intervals of time between the digital samples. This causes that said filters accordingly output their associated digital samples S_1 to S_r with a corresponding time delay.

Starting times T1 to T_r of the digital filters 2_1 to 2_r are distributed as equidistantly as possible over the period or period duration PD, with the result that the associated weighting functions G_1 to G_r of the digital filters 2_1 to 2_r are accordingly distributed as equidistantly as possible over the period or period duration PD, see FIG. 1. As shown in FIG. 1, a plurality of the digital filters 2_1 to 2_r operate at the same time or in an overlapping manner at particular times.

The digital filters have a constant and identical oversampling ratio of 128, for example.

If the period duration PD is changed, the intervals of time or starting times T1 to T_r are corrected in such a manner that a distribution of the weighting functions G_1 to G_r which is as equidistant as possible within the period duration or period PD is retained, that is to say the digital samples S_1 to S_r are generated at intervals of time which are as identical as possible.

An averager 3 is used to form an average value of the digital samples S_1 to S_r generated during the period duration PD, the average value forming the value of the digital signal (DS) for the associated period duration PD.

Figure 3:
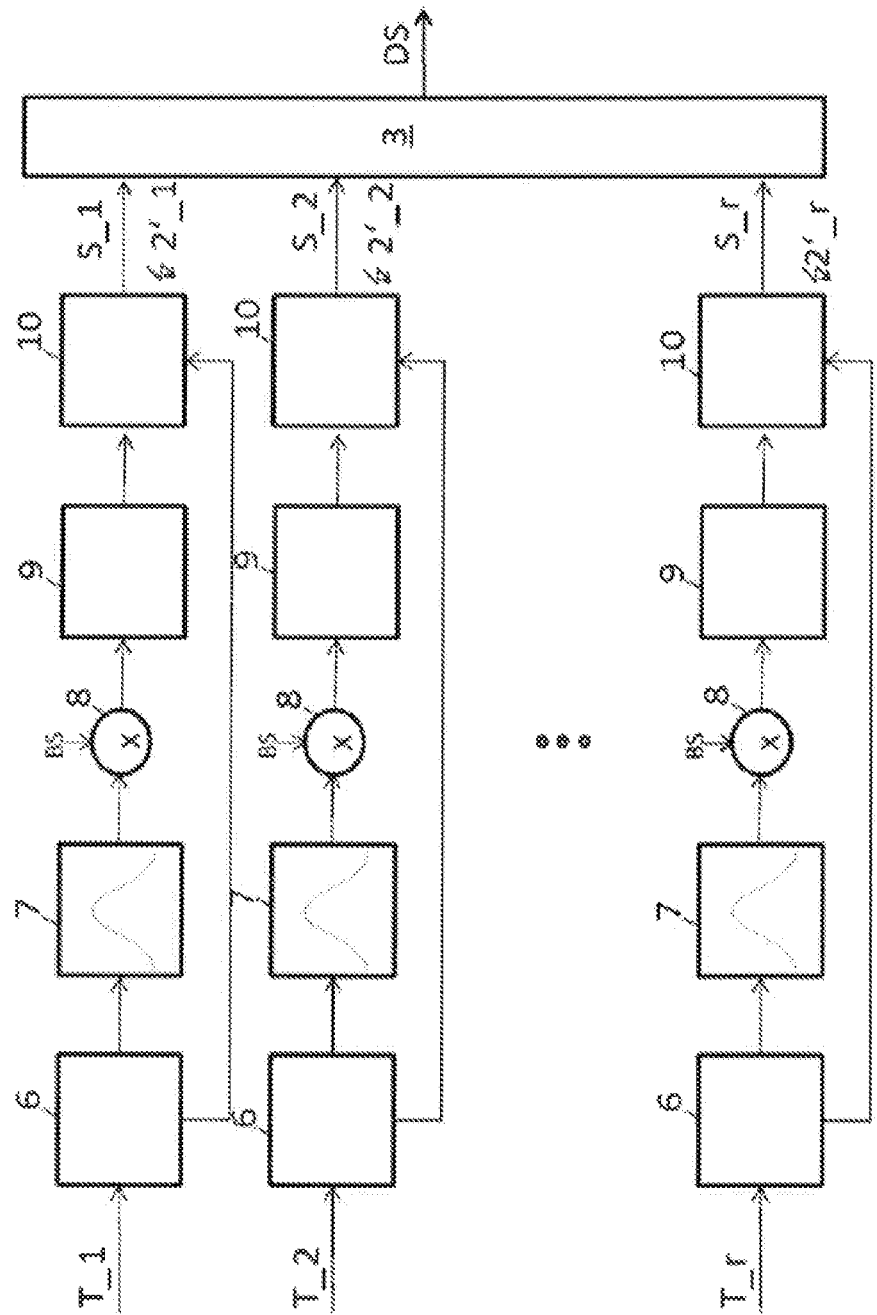
FIG. 3 shows a device for generating a digital signal from the analog signal shown in FIG. 1 according to another embodiment.

FIG. 3 shows a device for generating the digital signal DS from the analog signal UA shown in FIG. 1 according to another embodiment.

In the embodiment shown in FIG. 3, digital filters 2'_1 to 2'_r, as are described in the German patent application DE 10 2011 080 586 which was not prepublished and the disclosure of which is hereby incorporated in the content of the present description in so far as it relates to the digital filters 2'_1 to 2'_r, are used to produce the digital samples S_1 to S_r.

The digital filters 2'_1 to 2'_r each have a counter 6, a memory 7, a mixer 8, an integrator 9 and a buffer 10. With respect to the function of these units, reference is made to DE 10 2011 080 586.

The driving of the digital filters 2_1 to 2_r and 2'_1 to 2'_r and of the averager 3, the calculation of the optimum intervals of time and further general control tasks are carried out by a control unit (not shown). All of the units may be integrated in an FPGA, for example.

Figure 4:
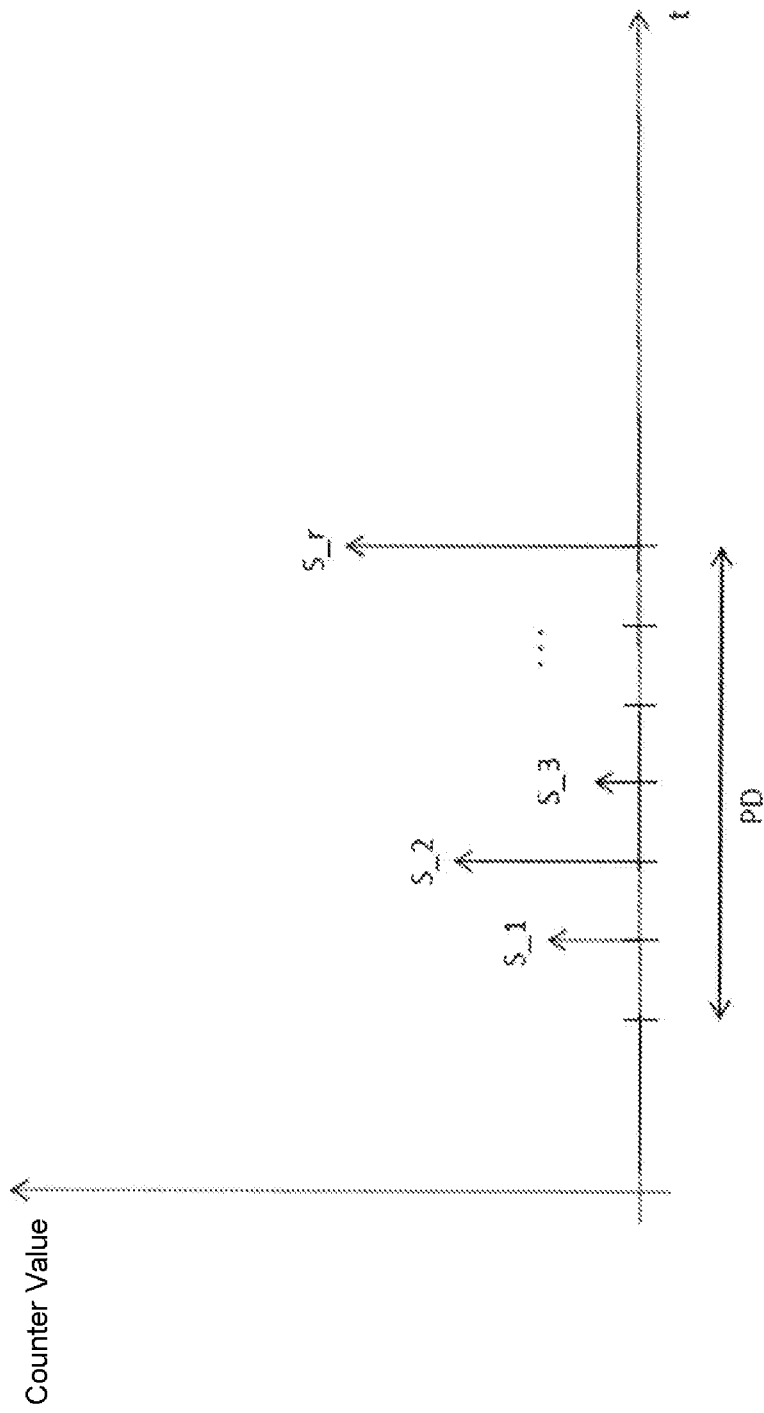
FIG. 4 shows the distribution of digital samples over an associated period duration.

FIG. 4 shows, by way of example, how the digital samples S_1 to S_r are generated in temporal succession using the associated digital filters 2_1 to 2_r and 2'_1 to 2'_r.

According to the invention, instead of an individual digital filter which produces an individual sample or a plurality of digital samples per period in temporal succession, a plurality of digital filters are operated in an interleaved manner, in which case, in order to adapt to a variable period duration, the starting times of the plurality of digital filters are corrected in such a manner that the digital samples generated by the digital filters are distributed as equidistantly as possible in terms of time over the period or period duration.

The invention claimed is:

1. A method for generating a digital signal from an analog signal, wherein the analog signal is generated by means of a frequency converter on the basis of pulse width modulation having a variable period duration, wherein values of the digital signal correspond to an average value of the analog signal over an associated period duration of the pulse width modulation, the method comprising the acts of:
   generating a bit stream on the basis of the analog signal using a sigma-delta modulator, wherein the bit stream is generated having a constant modulator clock;
   generating temporally successive digital samples during an associated period duration by filtering the bit stream using a number of digital filters;
   wherein intervals of time between the temporally successive digital samples are multiples of the modulator clock;
   wherein the digital filters are started with a time delay with respect to one another, wherein the time delay is equal to the intervals of time, and
   wherein a respective digital filter outputs an associated digital sample; and
   forming an average value of the digital samples generated during the associated period duration, wherein the average value forms the value of the digital signal (DS) for the associated period duration.

2. The method according to claim 1, wherein the intervals of time between the temporally successive digital samples are set on the basis of the variable period duration.

3. The method according to claim 1, wherein a respective digital filter has a $sinc^3$ filter function.

4. The method according to claim 1, wherein a respective digital filter is designed to output an associated digital sample every n modulator clocks.

5. The method according to claim 4, wherein the intervals of time between the temporally successive digital samples in modulator clock units are smaller than n.

6. The method according to claim 5, wherein $64 \leq n \leq 128$.

7. The method according to claim 4, wherein $64 \leq n \leq 128$.

8. The method according to claim 1, wherein the digital filters each have identical weighting functions, wherein the digital filters are started with a time delay with respect to one another in such a manner that weighting functions of digital filters which produce temporally adjacent digital samples at least partially overlap.

9. The method according to claim 1, wherein the period duration is in a range between 62.5 µs and 1 ms.

10. A device for generating a digital signal from an analog signal generated using a frequency converter on the basis of pulse width modulation having a variable period duration, wherein the device is designed to carry out the method according to claim 1, wherein the device comprises:
   a sigma-delta modulator for generating the bit stream;
   a number of digital filters for filtering the bit stream and generating the digital samples; and
   an averager for forming the average value of the digital samples generated during the period duration.

* * * * *